(12) United States Patent
Shimizu et al.

(10) Patent No.: US 10,309,988 B2
(45) Date of Patent: Jun. 4, 2019

(54) PROBE GUIDE PLATE AND PROBE DEVICE

(71) Applicants: SHINKO ELECTRIC INDUSTRIES CO., LTD., Nagano-shi, Nagano (JP); JAPAN ELECTRONIC MATERIALS CORPORATION, Amagasaki-shi, Hyogo (JP)

(72) Inventors: Yuichiro Shimizu, Nagano (JP); Kosuke Fujihara, Nagano (JP); Katsunori Yamagishi, Nagano (JP); Koji Nagai, Nagano (JP)

(73) Assignees: SHINKO ELECTRIC INDUSTRIES CO., LTD., Nagano-Shi (JP); JAPAN ELECTRONIC MATERIALS CORPORATION, Amagasaki-Shi (JP)

( * ) Notice: Subject to any disclaimer, the term of this patent is extended or adjusted under 35 U.S.C. 154(b) by 0 days.

(21) Appl. No.: 15/407,427

(22) Filed: Jan. 17, 2017

(65) Prior Publication Data
US 2017/0205445 A1 Jul. 20, 2017

(30) Foreign Application Priority Data
Jan. 18, 2016 (JP) .................... 2016-006980

(51) Int. Cl.
*G01R 1/073* (2006.01)
(52) U.S. Cl.
CPC .................. *G01R 1/07371* (2013.01)
(58) Field of Classification Search
CPC .................................. G01R 1/07371
See application file for complete search history.

(56) References Cited

U.S. PATENT DOCUMENTS

| | | | | |
|---|---|---|---|---|
| 7,546,670 B2 * | 6/2009 | Dalton | ............... | G01R 1/07371 29/557 |
| 2004/0212383 A1 * | 10/2004 | Yanagisawa | ......... | G01R 1/0441 324/754.08 |
| 2012/0319711 A1 * | 12/2012 | Hung | ................. | G01R 1/07371 324/750.16 |
| 2014/0266275 A1 | 9/2014 | Kimura et al. | | |
| 2016/0274147 A1 * | 9/2016 | Hsu | ........................ | G01R 1/067 |

FOREIGN PATENT DOCUMENTS

| JP | 2007-057447 | 3/2007 |
|---|---|---|
| JP | 2012-093127 | 5/2012 |
| JP | 2014-181910 | 9/2014 |

\* cited by examiner

*Primary Examiner* — Jermele M Hollington
*Assistant Examiner* — Feba Pothen
(74) *Attorney, Agent, or Firm* — Rankin, Hill & Clark LLP

(57) ABSTRACT

A probe guide plate includes a first silicon substrate, a first recess portion formed in an upper surface of the first silicon substrate, first through-holes formed in the first silicon substrate at a bottom of the first recess portion, a second silicon substrate directly bonded on the first silicon substrate, a second recess portion formed to face the first recess portion in a lower surface of the second silicon substrate, and second through-holes formed in the second silicon substrate at a bottom of the second recess portion and arranged to correspond to the first through-holes, A notch portion is formed at an upper end portion of an inner wall of each of the first through-holes of the first silicon substrate.

5 Claims, 16 Drawing Sheets

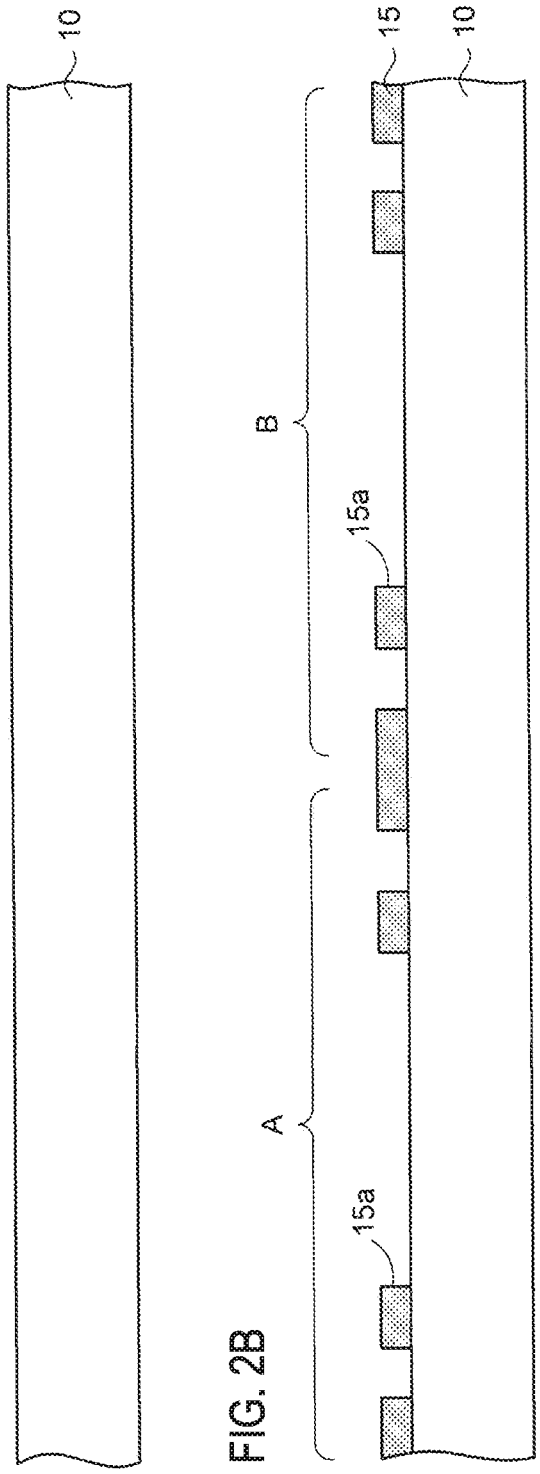

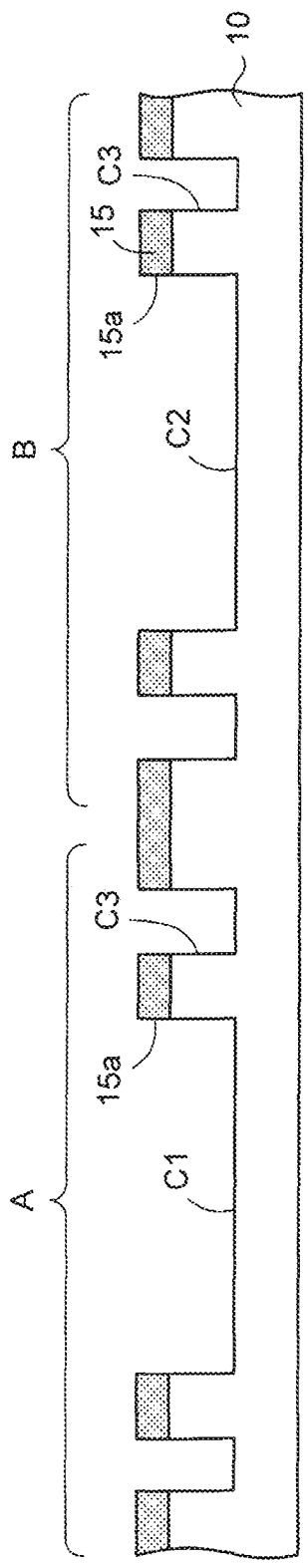
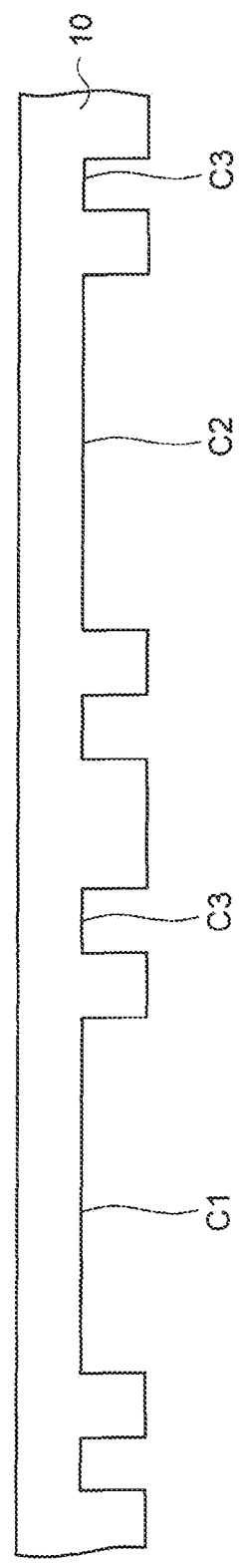

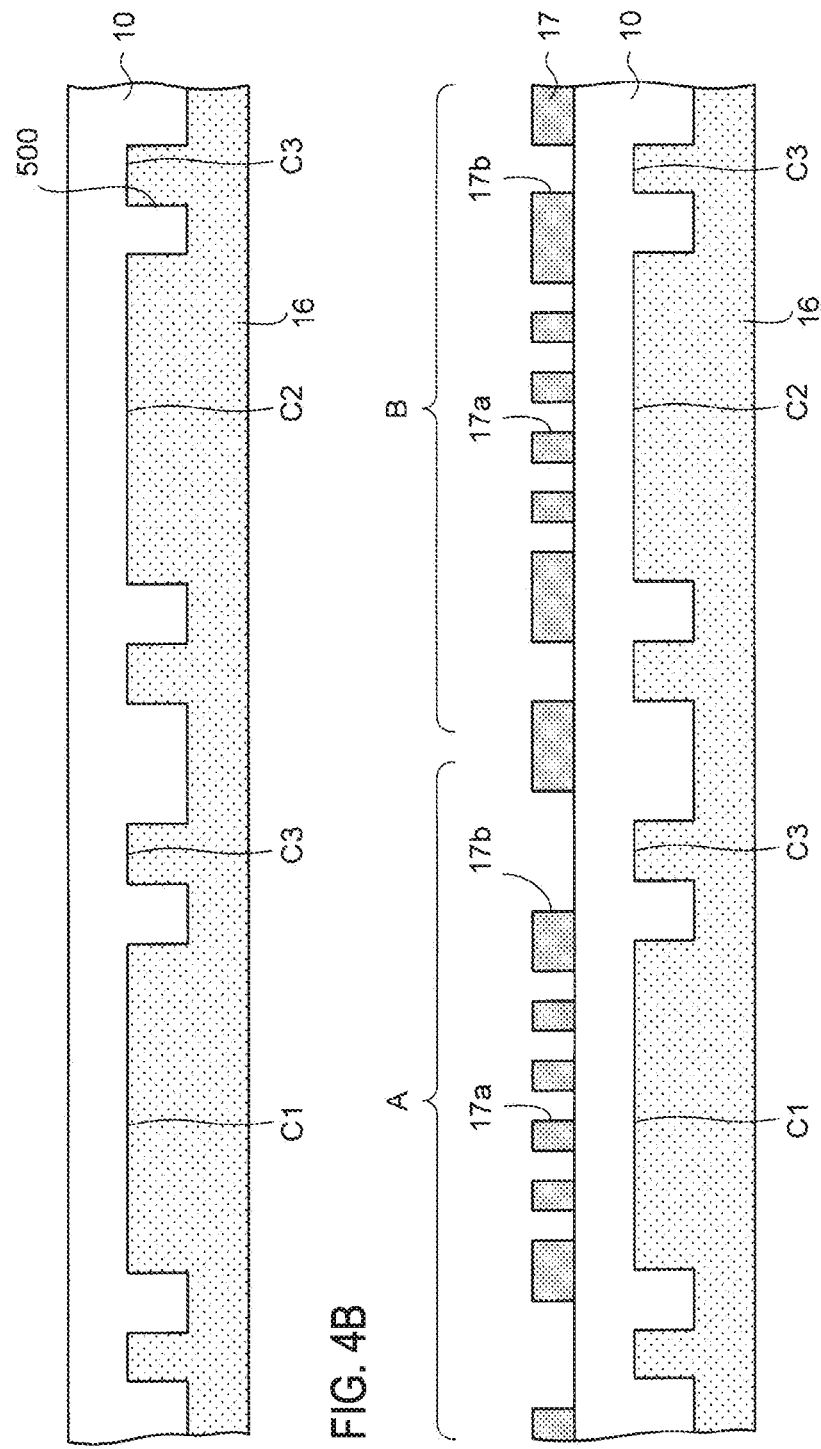

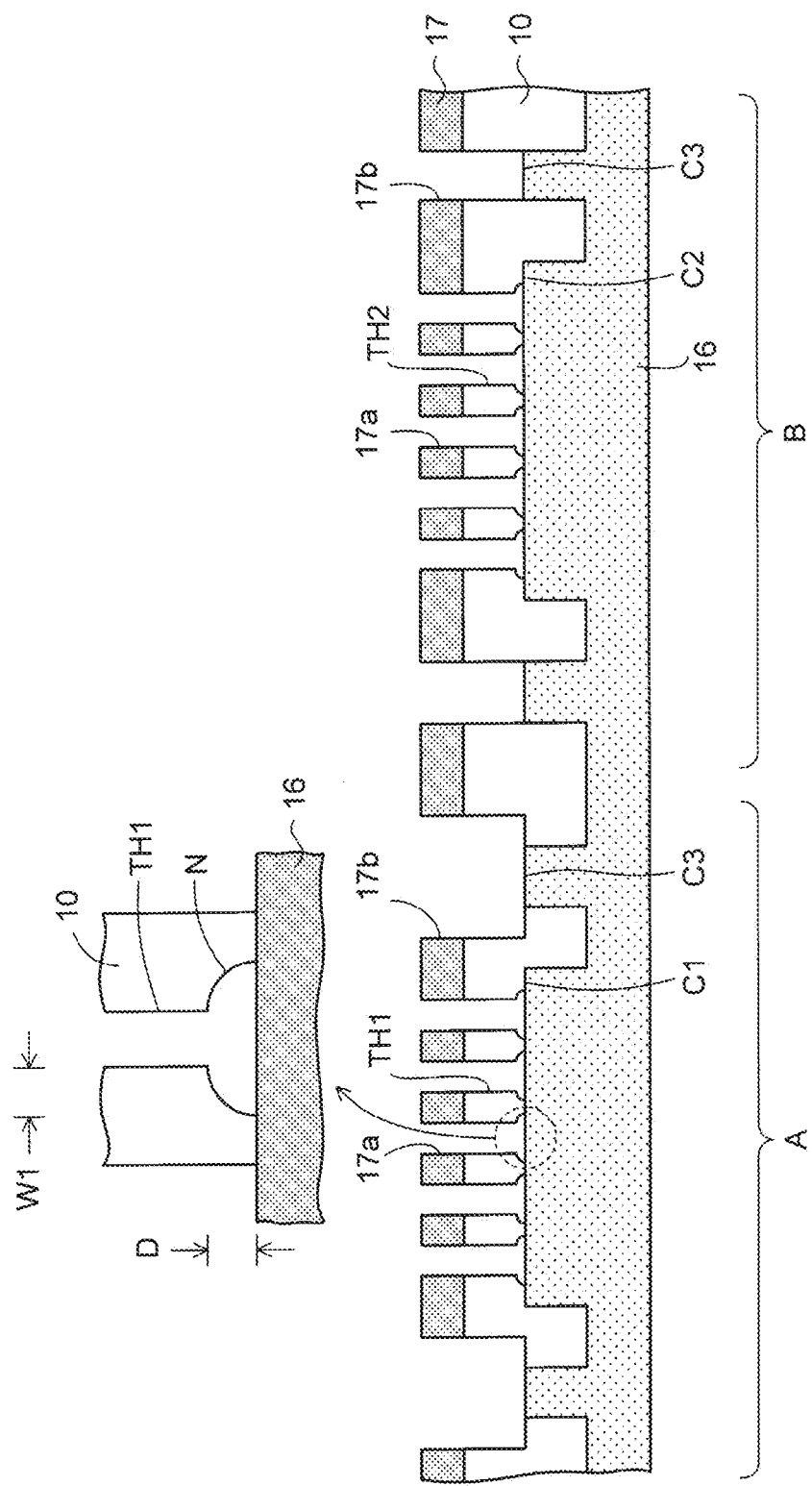

PROBE GUIDE PLATE AND PROBE DEVICE

CROSS-REFERENCE TO RELATED APPLICATION

The present application claims priority from Japanese Patent Application No. 2016-006980 filed on Jan. 18, 2016, the entire content of which is incorporated herein by reference.

BACKGROUND

Technical Field

The present disclosure relates to a probe guide plate, a probe device, a method of manufacturing the probe guide plate, and a method of manufacturing the probe device.

Related Art

Electric characteristics of a testing target such as a semiconductor device are measured by bringing probe terminals of a probe device into contact with a plurality of electrode pads of the testing target for electrical conduction. The probe device has a probe guide plate having through-holes formed therein, and the probe terminals are inserted into the through-holes of the probe guide plate, so that the probe terminals are positioned.

[Patent Document 1] Japanese Patent Application Publication No. 2007-57447A

[Patent Document 2] Japanese Patent Application Publication No. 2014-181910A

As described in preliminary matters, which will be described later, as the probe guide plate, a probe guide plate having two guide plates bonded to each other via a spacer so as to improve strength has been known.

In order to manufacture the probe guide plate, it is necessary to separately manufacture the two guide plates and the spacer and to assemble the same. For this reason, the number of components increases, which increases the cost.

Also, since a structure where there are many bonding places is made, a failure due to deterioration at the bonding places is likely to occur, so that a lifetime of the probe guide plate is shortened.

SUMMARY

Exemplary embodiments of the invention provide a novel probe guide plate of which two guide plates are stacked with high reliability at low cost, a probe device, a method of manufacturing the probe guide plate, and a method of manufacturing the probe device.

A probe guide plate according to an exemplary embodiment comprises:

a first silicon substrate;

a first recess portion formed in an upper surface of the first silicon substrate;

first through-holes formed in the first silicon substrate at a bottom of the first recess portion;

a second silicon substrate directly bonded on the first silicon substrate;

a second recess portion formed to face the first recess portion in a lower surface of the second silicon substrate; and second through-holes formed in the second silicon substrate at a bottom of the second recess portion and arranged to correspond to the first through-holes, wherein a notch portion is formed at an upper end portion of an inner wall of each of the first through-holes of the first silicon substrate.

A manufacturing method of a probe guide plate, according to an exemplary embodiment, comprises:

preparing a silicon substrate having a plurality of guide plate regions defined therein;

forming recess portions in the plurality of guide plate regions of the silicon substrate, respectively;

forming through-holes in the silicon substrate at bottoms of the recess portions arranged in the plurality of guide plate regions, respectively;

cutting the silicon substrate to divide and obtain a first silicon substrate and a second silicon substrate from the plurality of guide plate regions;

making the recess portion of the first silicon substrate and the recess portion of the second silicon substrate face each other and directly bonding the second silicon substrate on the first silicon substrate so that the through-holes of the first silicon substrate and the through-holes of the second silicon substrate correspond to each other; and forming a silicon oxide layer on exposed surfaces of the first silicon substrate and the second silicon substrate.

According to the present invention, in the probe guide plate, the second silicon substrate is directly bonded on the first silicon substrate. The first recess portion is formed in the upper surface of the first silicon substrate, and the first through-holes are formed in the bottom of the first recess portion.

Also, the second recess portion facing the first recess portion is formed in the lower surface of the second silicon substrate, and the second through-holes are formed to correspond to the first through-holes in the bottom of the second recess portion.

Thereby, since the first silicon substrate and the second silicon substrate are directly bonded to each other, it is possible to reduce the number of components and to save the cost. Also, the first silicon substrate and the second silicon substrate are strongly bonded, so that the strong mechanical strength is secured.

Also, since the bonding place in the probe guide plate 1 is one, it is possible to improve the bonding reliability.

Also, the notch portions are formed at the upper end portions of the inner walls of the first through-holes of the first silicon substrate. Thereby, even when the first through-holes and the second through-holes are arranged with being misaligned upon the insertion of the probe terminals from the second through-holes into the first through-holes, the probe terminals are guided downward by the inclined notch portions N. Thereby, it is possible to smoothly insert the probe terminals from the second through-holes into the first through-holes.

BRIEF DESCRIPTION OF THE DRAWINGS

FIGS. 2A and 2B are sectional views depicting a manufacturing method of a probe guide plate in accordance with an exemplary embodiment (1 thereof).

FIGS. 3A and 3B are sectional views depicting the manufacturing method of the probe guide plate in accordance with the exemplary embodiment (2 thereof).

FIGS. 4A and 4B are sectional views depicting the manufacturing method of the probe guide plate in accordance with the exemplary embodiment (3 thereof).

FIG. 5 is a sectional view depicting the manufacturing method of the probe guide plate in accordance with the exemplary embodiment (4 thereof).

DETAILED DESCRIPTION

Hereinafter, exemplary embodiments will be described with reference to the accompanying drawings.

Before describing the exemplary embodiment, preliminary matters, which are bases of the present invention, are first described. It should be noted that the description of the preliminary matters are personal investigation contents of the inventors and include a novel technology, which is not a known technology.

As a probe guide plate used for a probe device, a probe guide plate having two guide plates bonded to each other via a spacer so as to improve strength has been known.

Figure 1:
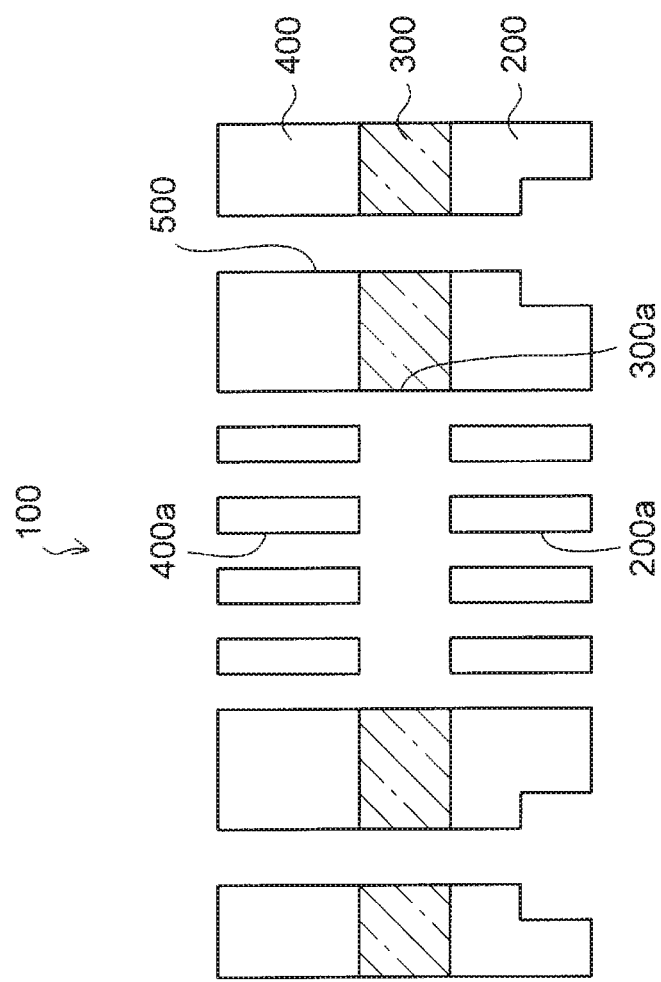
FIG. 1 is a sectional view depicting a probe guide plate in accordance with preliminary matters.

FIG. 1 depicts an example of the probe guide plate. In a probe guide plate 100 of the preliminary matters, a lower guide plate 200 and an upper guide plate 400 are bonded to each other via a spacer 300. The lower guide plate 200, the spacer 300 and the upper guide plate 400 are formed of ceramics, for example.

A plurality of first through-holes 200a is formed at a central part of the lower guide plate 200. Also, a collective opening 300a of the spacer 300 is formed above a region in which the first through-holes 200a of the lower guide plate 200 are arranged.

Also, the upper guide plate 400 is formed with second through-holes 400a at positions corresponding to the first through-holes 200a.

Also, a peripheral edge part of the probe guide plate 100 is formed with screwing holes 500 configured to penetrate therethrough.

Probe terminals are inserted from the upper-side second through-holes 400a of the probe guide plate 100 into the lower-side first through-holes 200a, so that the probe terminals are positioned.

In order to manufacture the probe guide plate 100 relating to the preliminary matters, it is necessary to separately manufacture the lower guide plate 200, the upper guide plate 400 and the spacer 300 and to assemble the same. For this reason, the position precision of the lower guide plate 200 and the upper guide plate 400 is poor and the number of components increases, which increases the cost.

Also, since the lower guide plate 200, the spacer 300 and the upper guide plate 400 are assembled by bonding the same, a structure where there are many bonding places is made. For this reason, a failure due to deterioration at the bonding places is likely to occur, so that a lifetime of the probe guide plate is shortened.

According to a probe guide plate of an exemplary embodiment to be described below, it is possible to solve the above problems.

(Exemplary Embodiment)

Figure 9:
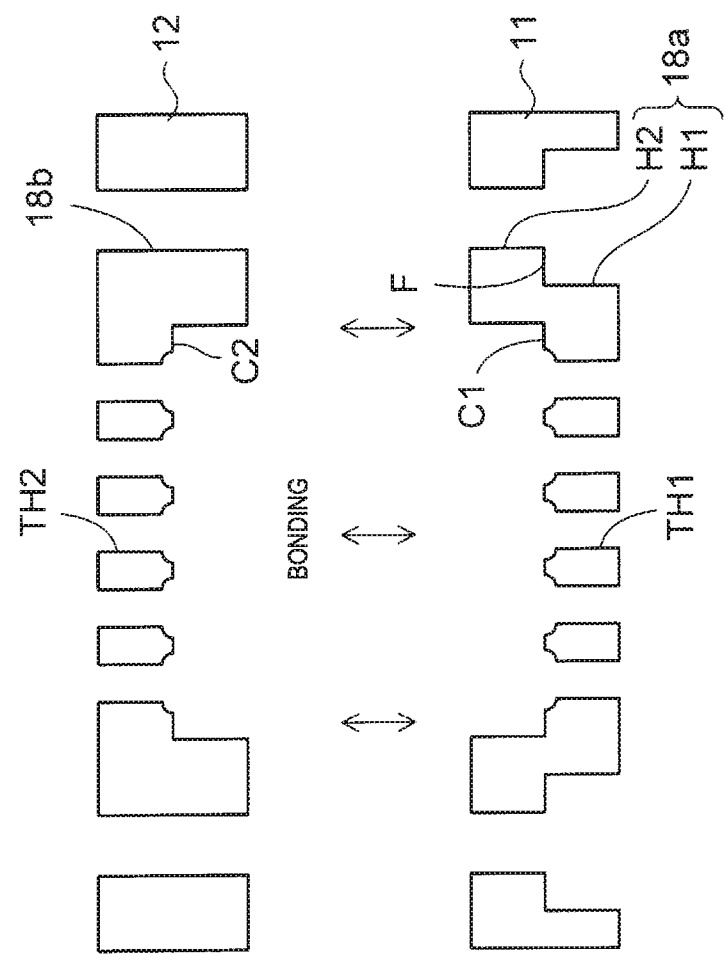
FIG. 9 is a sectional view depicting the manufacturing method of the probe guide plate in accordance with the exemplary embodiment (7 thereof).
Figure 10:
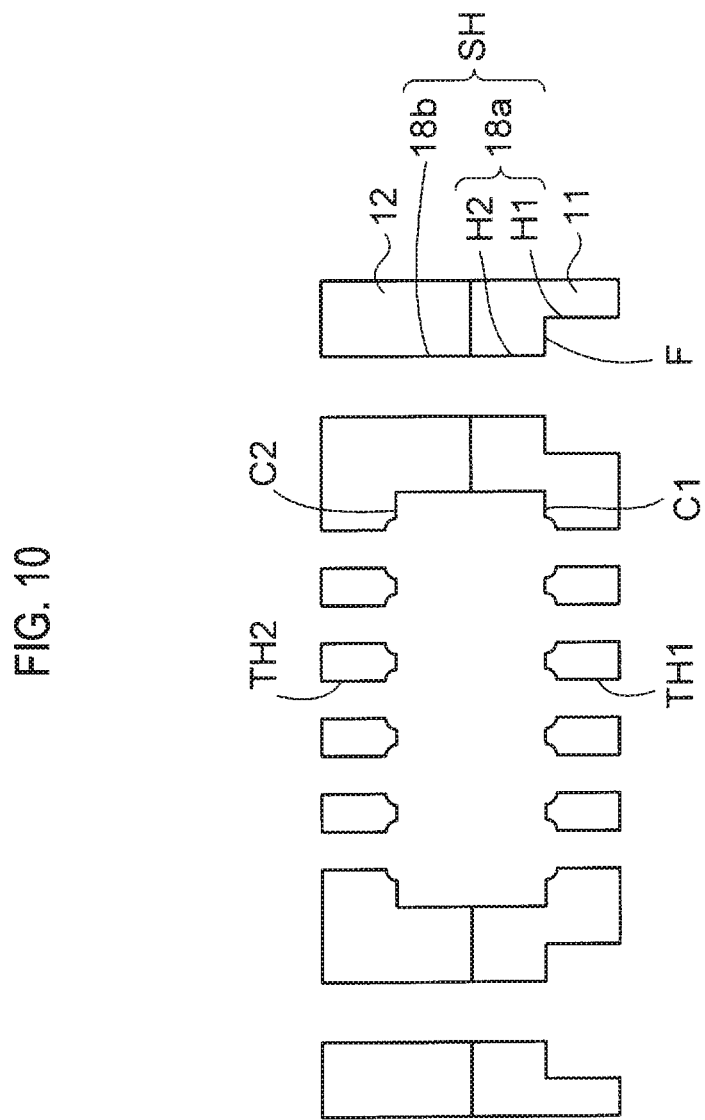
FIG. 10 is a sectional view depicting the manufacturing method of the probe guide plate in accordance with the exemplary embodiment (8 thereof).
Figure 11:
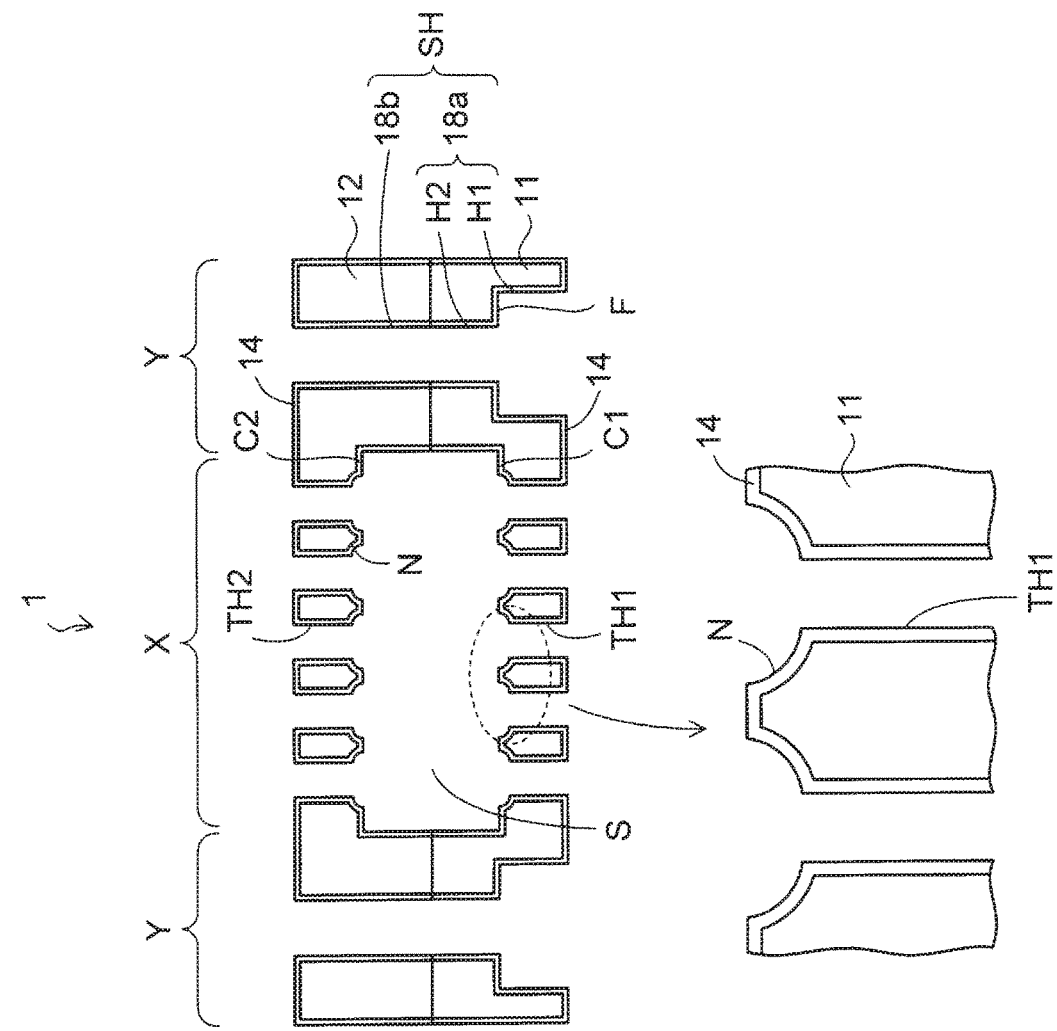
FIG. 11 is a sectional view depicting the probe guide plate of the exemplary embodiment.
Figure 12:
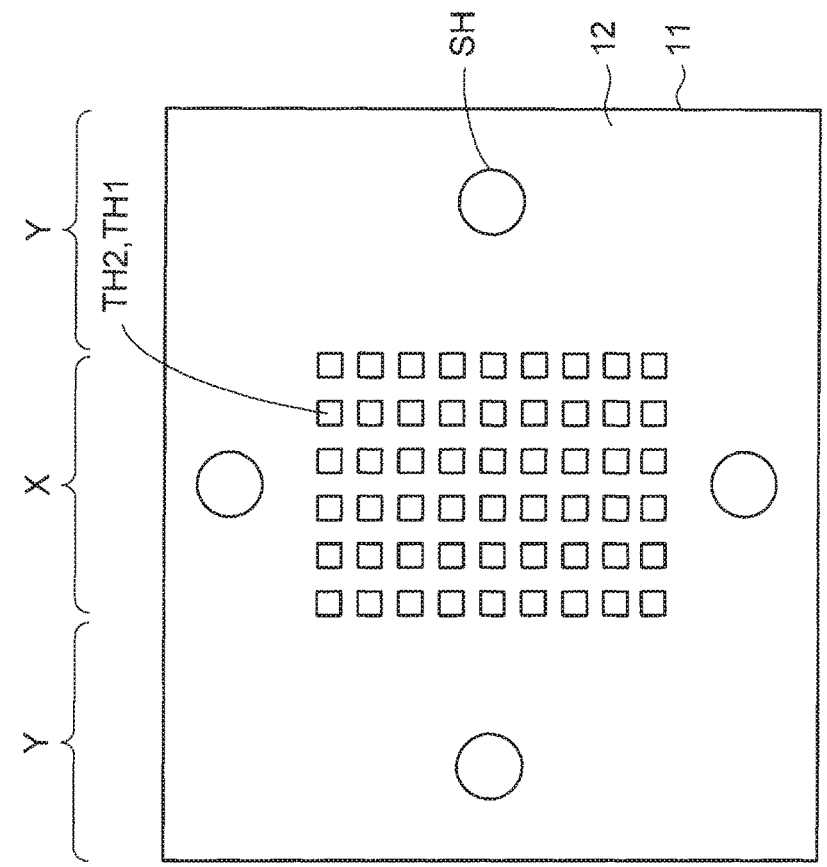
FIG. 12 is a plan view depicting the probe guide plate of the exemplary embodiment.
Figure 13:
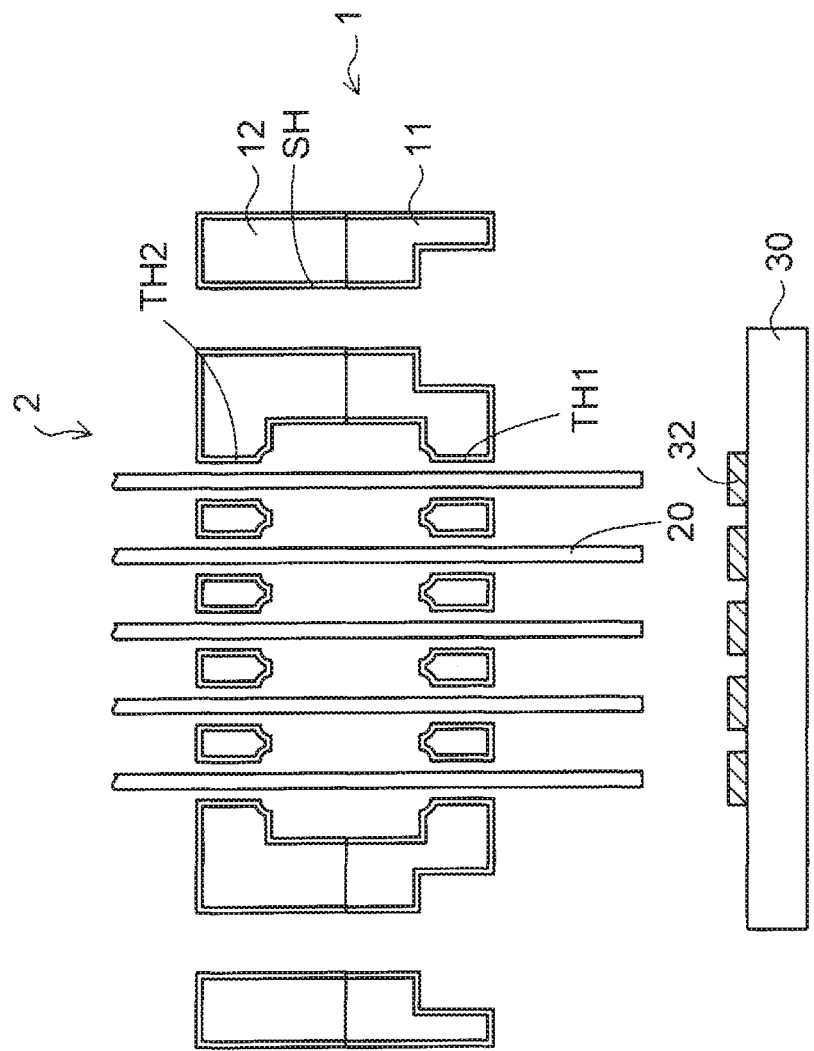
FIG. 13 is a sectional view depicting a probe device of the exemplary embodiment.

FIGS. 2A to 10 illustrate a manufacturing method of a probe guide plate of an exemplary embodiment, FIGS. 11 and 12 illustrate the probe guide plate of the exemplary embodiment, and FIG. 13 illustrates a probe device of the exemplary embodiment. In the below, while describing the manufacturing method of the probe guide plate, structures of the probe guide plate and the probe device are described.

In the manufacturing method of the probe guide plate of the exemplary embodiment, as shown in FIG. 2A, a silicon substrate 10 is first prepared. As the silicon substrate 10, a silicon wafer having a thickness of about 400 μm is used, for example. A backside of a silicon wafer having a thickness of about 800 μm is grinded and adjusted to a required thickness by a back grinder apparatus.

Then, as shown in FIG. 2B, a resist layer 15 having openings 15a is formed on the silicon substrate 10 by patterning.

The resist layer 15 is formed by applying liquid resist, exposing the resist via a photomask on the basis of photolithography and then developing the same. Alternatively, the resist layer 15 may be formed using a dry film resist.

A plurality of guide plate regions for obtaining each guide plate is defined in the silicon substrate 10. In FIG. 2B and thereafter, a first guide plate region A and a second guide plate region B are partially shown.

Subsequently, as shown in FIG. 3A, the silicon substrate 10 is partially etched in a thickness direction thereof by an anisotropic dry etching via the openings 15a of the resist layer 15. As the anisotropic dry etching, a DRIE (Deep Reactive Ion Etching) using $SF_6$-based gas or the like is used.

Thereby, a first recess portion C1 is formed at a central part of the first guide plate region A, and a second recess portion C2 is formed at a central part of the second guide plate region B. Depths of the first recess portion C1 and the second recess portion C2 are set to about a half of the thickness of the silicon substrate 10, for example.

As described later, a plurality of through-holes is arranged in the silicon substrate 10 at a bottom of the first recess portion C1 of the first guide plate region A. Also, likewise, a plurality of through-holes is arranged in the silicon substrate 10 at a bottom of the second recess portion C2 of the second guide plate region B. The first recess portion C1 and the second recess portion C2 have a rectangular shape, as seen from above, for example.

Also, third recess portions C3 are respectively formed at respective peripheral edge parts of the first guide plate region A and the second guide plate region B. The third recess portions C3 are formed so as to establish screwing holes at the respective peripheral edge parts of the first guide plate region A and the second guide plate region B. The third recess portion C3 has a hole shape, as seen from above.

Alternatively, the first recess portion C1, the second recess portion C2 and the third recess portions C3 may be formed in the silicon substrate 10 by a wet etching, instead of the anisotropic dry etching.

Then, as shown in FIG. 3B, the resist layer 15 is removed and then a structure of FIG. 3A is vertically inverted.

Subsequently, as shown in FIG. 4A, a resin film 16 is bonded to a lower surface of the silicon substrate 10 in which the first to third recess portions C1, C2, C3 are formed. As the resin film 16, a silicon resin film or the like that can be easily peeled off is used.

Also, as shown in FIG. 4B, a resist layer 17 having first openings 17a and second openings 17b is formed on an upper surface of the silicon substrate 10 of FIG. 4A. The plurality of first openings 17a of the resist layer 17 is arranged so as to form a plurality of through-holes in the silicon substrate 10 at the bottoms of the first recess portion C1 and the second recess portion C2.

Also, the second openings 17b of the resist layer 17 are formed at portions corresponding to the third recess portions C3 of the silicon substrate 10, and are arranged so as to establish the screwing holes.

In the example of FIG. 4B, in the first guide plate region A, a diameter of the second opening 17b of the resist layer 17 is set to be greater than a diameter of the third recess portion C3. On the other hand, in the second guide plate region B, a diameter of the second opening 17b of the resist layer 17 is set to be the same as the diameter of the third recess portion C3.

Then, as shown in FIG. 5, the silicon substrate 10 is etched up to the resin film 16 in the thickness direction by the anisotropic dry etching through the first openings 17a and the second openings 17b of the resist layer 17.

As the anisotropic dry etching, a DRIE (Deep Reactive Ion Etching) using $SF_6$-based gas or the like is used.

Thereby, a plurality of first through-holes TH1 is formed at the central part of the first guide plate region A of the silicon substrate 10. Also, at the same time, a plurality of second through-holes TH2 is formed at the central part of the second guide plate region B of the silicon substrate 10.

At this time, as shown in a partially enlarged sectional view of FIG. 5, a lower end portion of an inner wall of the first through-hole TH1 is side-etched outward, so that a notch portion N having a notched shape is formed at the lower end portion of the inner wall of the first through-hole TH1. The notch portion is formed into the same shape in the second through-hole TH2, too.

The reason is described. When the etching of the silicon substrate 10 is over and an over etching is performed, the resin film 16, which is an insulator, is exposed to bottoms of the first through-holes TH1. For this reason, positive (+) ions of plasma remain on the bottoms of the first through-holes TH1 and diffuse outward, so that the inner walls of the first through-holes TH1 are etched.

When a conductor layer such as a metal layer is arranged instead of the resin film 16, positive (+) ions flow from the bottoms of the first through-holes TH1 to the conductor layer. Therefore, the notch portion N is not formed at the lower end portion of the inner wall of the first through-hole TH1.

For example, when a thickness of the silicon substrate 10 is about 100 μm and an over etching amount is set to 20%, the notch portion N of which a width W1 is about 10 μm and a depth D is about 10 μm is formed.

In the meantime, the notch portion N may be formed at the third recess portion C3 in the second guide plate region B of FIG. 5, too. However, it is not shown in FIG. 5.

Figure 6:
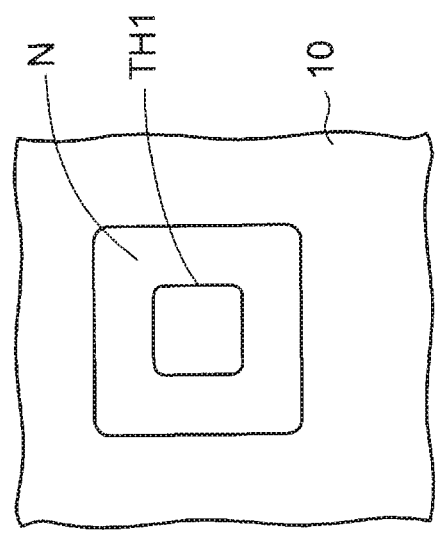
FIG. 6 is a plan view depicting a notch portion formed at a first through-hole of FIG. 5, as seen from below.
Figure 7:
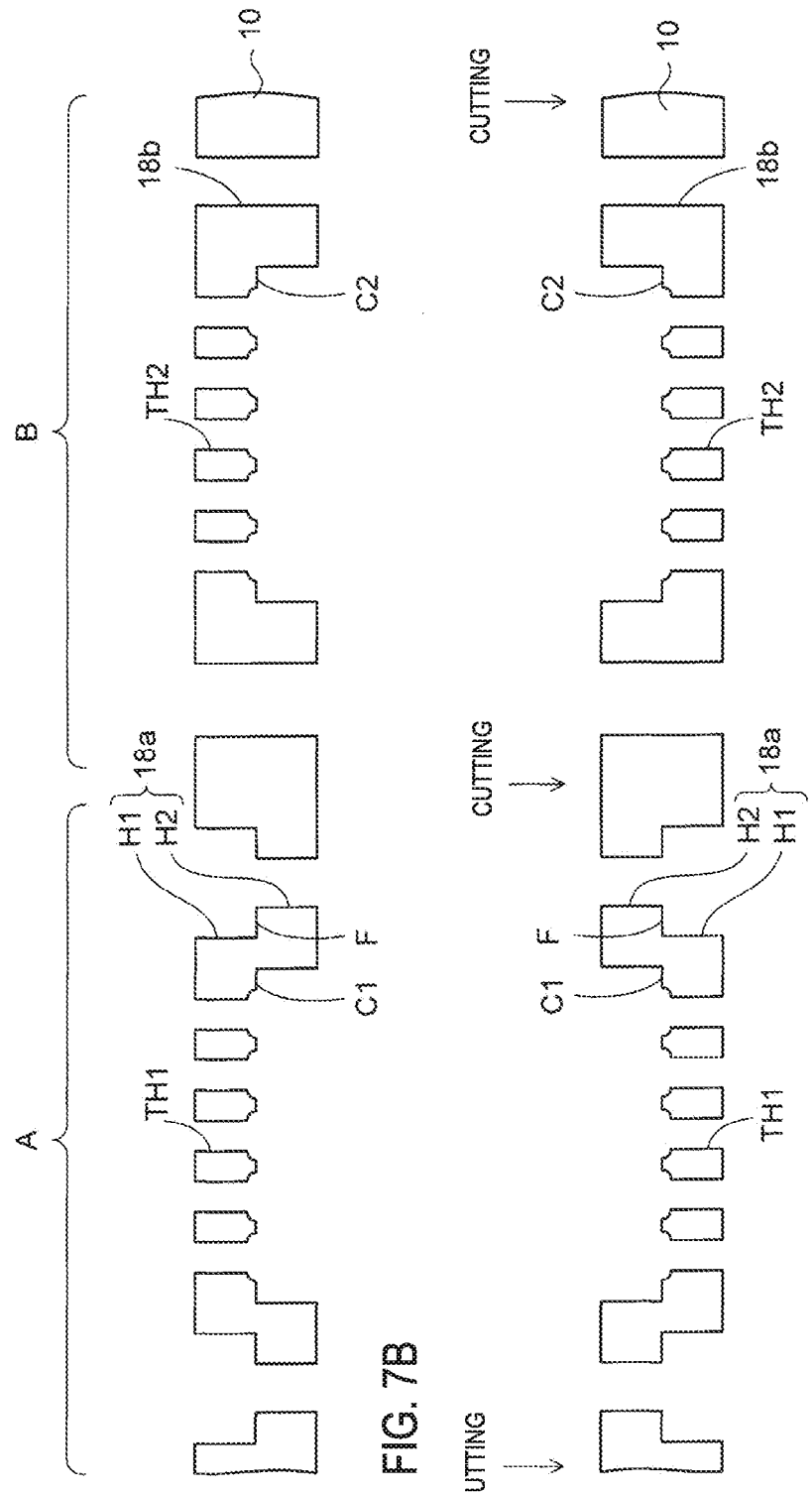
FIGS. 7A and 7B are sectional views depicting the manufacturing method of the probe guide plate in accordance with the exemplary embodiment (5 thereof).

FIG. 6 is a partially enlarged plan view of the notch portion N, which is formed at the first through-hole TH1 of FIG. 5, as seen from below. As shown in FIG. 6, the first through-hole TH1 has a rectangular shape, as seen from below, and the notch portion N is formed with being annularly connected in a surrounding region of the lower end portion of the inner wall of the first through-hole TH1.

A size of the first through-hole TH1 is about 20 μm×20 μm to 100 μm×100 μm, for example. Also, an arrangement pitch of the first through-holes TH1 is set to 40 μm to 150 μm, for example. A planar shape of the first through-hole TH1 may be circular, elliptical or the like, in addition to the rectangular shape.

FIG. 7A depicts a state where the resist layer 17 has been removed from the structure of FIG. 5 and the resin film 16 has been peeled off.

As shown in FIG. 7A, during the etching process of FIG. 5, a part of the silicon substrate 10 on the third recess portion C3 (FIG. 4B) is etched at the peripheral edge part of the first guide plate region A, so that a large-diameter hole H1 having a diameter greater than the diameter of the third recess portion C3 is formed on the third recess portion C3. The third recess portion C3 becomes a small-diameter hole H2 communicating with the large-diameter hole H1.

Thereby, a first opening hole 18a is formed by the large-diameter hole H1 and the small-diameter hole H2. A step surface F is formed on an inner wall of the first opening hole 18a.

In the meantime, a part of the silicon substrate 10 corresponding to the third recess portion C3 is etched at the peripheral edge part of the second guide plate region B, so that a second opening hole 18b having a straight-shaped inner wall is formed.

Then, as shown in FIG. 7B, the structure of FIG. 7A is vertically inverted, so that the first recess portion C1 and the second recess portion C2 are arranged to face upward. Also, the silicon substrate 10 is cut along a dicing line so that the first guide plate region A and the second guide plate region B are divided.

Figure 8:
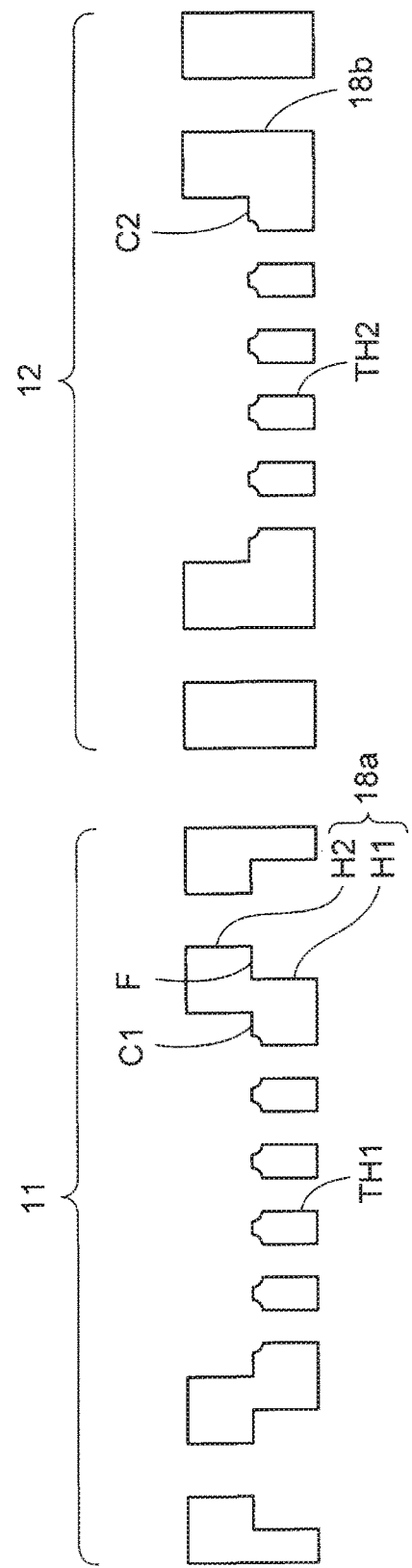
FIG. 8 is a sectional view depicting the manufacturing method of the probe guide plate in accordance with the exemplary embodiment (6 thereof).

Thereby, as shown in FIG. 8, a first silicon substrate 11 is obtained from the first guide plate region A of the silicon substrate 10, and a second silicon substrate 12 is obtained from the second guide plate region B.

Subsequently, as shown in FIGS. 9 and 10, the second silicon substrate 12 is arranged on the first silicon substrate 11 so that the first recess portion C1 of the first silicon substrate 11 and the second recess portion C2 of the second silicon substrate 12 face each other, and then both substrates are directly bonded.

At this time, as shown in FIG. 10, the second silicon substrate 12 is stacked on the first silicon substrate 11 with the first through-holes TH1 of the first silicon substrate 11 and the second through-holes TH2 of the second silicon substrate 12 being aligned so as to correspond to each other.

Also, as shown in FIG. 10, the second silicon substrate 12 is stacked on the first silicon substrate 11 with the first opening holes 18a of the first silicon substrate 11 and the second opening holes 18b of the second silicon substrate 12 being aligned.

In order to align the first silicon substrate 11 and the second silicon substrate 12, the first silicon substrate 11 and the second silicon substrate 12 are first vacuum-adsorbed to transparent adsorption plates (not shown) made of glass or the like, respectively.

Then, alignment marks (not shown) formed on the respective bonding surfaces of the first silicon substrate 11 and the second silicon substrate 12 are image-recognized by the infrared (IR) through the transparent adsorption plates, and the aligning is performed so that the respective alignment marks are matched with each other.

In order to directly bond the first silicon substrate 11 and the second silicon substrate 12, the respective bonding surfaces of the first silicon substrate 11 and the second silicon substrate 12 are first polished by a CMP or the like and are thus made into mirror surfaces having a surface roughness (Ra) of 1 nm or less.

Then, the respective bonding surfaces of the first silicon substrate 11 and the second silicon substrate 12 are treated by a mixed solution of sulfuric acid and hydrogen peroxide solution, so that hydroxyl groups are attached to silicon surfaces of the respective bonding surfaces for hydrophilization. Alternatively, the respective bonding surfaces may be hydrophilized by an oxygen ($O_2$) plasma treatment.

Then, when the second silicon substrate 12 is superimposed on the first silicon substrate 11, they are weakly bonded by a hydrogen bonding via water molecules. At this state, when a heating treatment is performed to temperatures of 1,000° C. or higher, the moisture is evaporated, so that the second silicon substrate 12 is directly bonded on the first silicon substrate 11 by a strong bonding. Thereby, the first silicon substrate 11 and the second silicon substrate 12 are bonded with the strong bonding strength that is equivalent to the bulk silicon.

In this way, the respective mirror surfaces of the first silicon substrate 11 and the second silicon substrate 12 are directly bonded and are integrated without another material such as an adhesive.

Thereafter, as shown in FIG. 11, a silicon oxide layer 14 is formed on exposed surfaces of the first silicon substrate 11 and the second silicon substrate 12 by thermal oxidization. The silicon oxide layer 14 is formed as an insulation layer.

In the first silicon substrate 11, the silicon oxide layer 14 is formed on the lower surface, an inner surface of the first recess portion C1 in the upper surface, and respective inner walls of the first through-holes TH1 and the first opening holes 18a.

Also, likewise, in the second silicon substrate 12, the silicon oxide layer 14 is formed on the upper surface, an inner surface of the second recess portion C2 in the lower surface, and respective inner walls of the second through-holes TH2 and the second opening holes 18b.

Meanwhile, in the process of directly bonding the first silicon substrate 11 and the second silicon substrate 12, the silicon oxide layer 14 can also be formed at the same time.

By the above, a probe guide plate 1 of the exemplary embodiment is manufactured, as shown in FIG. 11.

In the exemplary embodiment, the first silicon substrate 11 and the second silicon substrate 12 are divided and obtained from the plurality of guide plate regions of one silicon substrate 10.

In addition to the above method, a method may also be possible in which a plurality of silicon substrates 10 is prepared, the first silicon substrates 11 are divided and obtained from a plurality of guide plate regions of one silicon substrate and the second silicon substrates 12 are divided and obtained from a plurality of guide plate regions of another silicon substrate.

In this way, the first silicon substrate 11 and the second silicon substrate 12 may be separately obtained from the plurality of silicon substrates.

When the above method is adopted, the thicknesses of the first silicon substrate 11 and the second silicon substrate 12 may be set different from each other.

As described later, when inserting a probe terminal from the second through-hole TH2 to the first through-hole TH1 of the probe guide plate 1, an effect of guiding the probe terminal by the notch portion N is accomplished if the notch portion N is formed at the lower-side first silicon substrate 11.

When the first silicon substrate 11 and the second silicon substrate 12 are formed from the separate silicon substrates, the first silicon substrate having the notch portion and the second silicon substrate having no notch portion can be separately manufactured.

For this reason, since a silicon substrate having no notch portion can be used as the second silicon substrate, it is possible to improve the manufacturing efficiency.

Also, the effect of guiding the probe terminal by the notch portion N is accomplished when the notch portion is provided at a silicon substrate arranged to face a silicon substrate from which the probe terminal is to be inserted. Therefore, in the exemplary embodiment, the first silicon substrate 11 is formed with the notch portions N for guiding the probe terminals. However, the present invention is not limited thereto.

As shown in FIG. 11, the probe guide plate 1 of the exemplary embodiment has the first silicon substrate 11 and the second silicon substrate 12 bonded on the first silicon substrate 11. The first silicon substrate 11 and the second silicon substrate 12 are directly bonded without another material such as an adhesive.

The first recess portion C1 is formed in an upper surface of a central part X of the first silicon substrate 11. In the first silicon substrate 11 at the bottom of the first recess portion C1, the plurality of first through-holes TH1 configured to penetrate the first silicon substrate from an upper surface to a lower surface is formed.

As shown in a partially enlarged sectional view of FIG. 11, the notch portion N having a notched shape is formed at an upper end portion of an inner wall of the first through-hole TH1. An inner surface of the notch portion N is inclined so that a height position thereof becomes lower from an upper end toward a lower end, and has a tapered shape.

In the example of FIG. 11, the inner surface of the notch portion N has a concave curved shape. However, a convex curved shape can also be adopted. Alternatively, a shape close to a straight inclined surface can also be adopted.

By adjusting conditions of the anisotropic dry etching or the over etching amount when forming the first through-holes TH1 and the second through-holes TH2 in the silicon substrate 10, the shape of the notch portion N is changed.

Also, a peripheral edge part Y of the first silicon substrate 11 is formed with the first opening holes 18a each of which consists of the small-diameter hole H2 partially formed from the upper surface in the thickness direction and the large-diameter hole H1 configured to communicate with the small-diameter hole H2 and formed to penetrate the first silicon substrate to the lower surface.

Also, a lower surface of the central part X of the second silicon substrate 12 is formed with the second recess portion C2 so as to face the first recess portion C1 of the first silicon substrate 11. Also, the plurality of second through-holes TH2 is formed in the second silicon substrate 12 at the bottom of the second recess portion C2.

The second through-holes TH2 of the second silicon substrate 12 are arranged with being aligned at positions corresponding to the first through-holes TH1 of the first silicon substrate 11.

Also, likewise, the notch portions N are formed at lower end portions of inner walls of the second through-holes TH2 of the second silicon substrate.

The first recess portion C1 of the first silicon substrate 11 and the second recess portion C2 of the second silicon substrate 12 are configured to face and communicate with each other, so that a space S is formed.

In this way, the first through-holes TH1 of the first silicon substrate 11 and the second through-holes TH2 of the second silicon substrate 12 are arranged to face each other with the space S being interposed therebetween.

Also, the peripheral edge part Y of the second silicon substrate 12 is formed with the second opening holes 18b of which inner walls are straight. The small-diameter hole H2 of the first opening hole 18a of the first silicon substrate 11 and the second opening hole 18b of the second silicon substrate 12 communicate with each other, so that a screwing hole SH is formed. The step surface F is formed on an inner wall surface of the screwing hole SH.

In this way, the peripheral edge part Y of the probe guide plate 1 is formed with the screwing holes SH penetrating therethrough. When incorporating the probe guide plate 1 into a probe device, heads of fixing screws are fixed in contact with the step surfaces F of the screwing holes SH.

FIG. 12 is a plan view of the probe guide plate 1 of FIG. 11, as seen from above. By referring to FIG. 12, in addition to FIG. 11, the plurality of second through-holes TH2 is arranged side by side at the central part X of the second silicon substrate 12. The first through-holes TH1 of the first silicon substrate 11 are respectively arranged with being aligned just below the respective second through-holes TH2.

Also, the screwing holes SH are arranged at four places of the peripheral edge portion Y of the probe guide plate 1.

In this way, the integrated probe guide plate 1 where the first silicon substrate 11 and the second silicon substrate 12 are directly bonded and the first through-holes TH1 and the second through-holes TH2 are arranged to face each other with the space S being interposed therebetween is established.

In the probe guide plate 1 of the exemplary embodiment, the first silicon substrate 11 and the second silicon substrate 12 are directly bonded without particularly using a spacer member. For this reason, it is possible to reduce the number of components, so that it is possible to save the manufacturing cost.

Also, since the first silicon substrate 11 and the second silicon substrate 12 are directly bonded, they are more strongly bonded, as compared to a configuration where an adhesive is used, so that the stronger mechanical strength is obtained. Also, the bonding place in the probe guide plate 1 is just one place of the bonding surface between the first silicon substrate 11 and the second silicon substrate. For this reason, a structure where a failure due to deterioration at the bonding places is difficult to occur is made, so that it is possible to improve the reliability.

Also, since the first silicon substrate 11 and the second silicon substrate 12 are directly bonded at one bonding surface, it is possible to perform the assembling with higher precision, as compared to a method where they are bonded via a spacer. Thereby, it is possible to align and arrange the first through-holes TH1 of the first silicon substrate 11 and the second through-holes TH1 of the second silicon substrate 12 with high precision.

Also, the first silicon substrate 11 and the second silicon substrate 12 can be formed to be vertically symmetric with respect to the bonding surface becoming an axis. In FIG. 11, the inner walls of the first opening holes 18a of the first silicon substrate 11 are formed to have a straight shape, so that a completely vertically symmetric structure is made.

For this reason, when performing a heating treatment upon the direct bonding of the first silicon substrate 11 and the second silicon substrate 12, a bending is difficult to occur. Also, likewise, when forming the silicon oxide layer 14 on the exposed surfaces of the first silicon substrate 11 and the second silicon substrate 12 by the thermal oxidization, a bending is difficult to occur.

Also, the first silicon substrate 11 and the second silicon substrate 12 are designed to have the same thickness, so that it is possible to obtain the first silicon substrate 11 and the second silicon substrate 12 from the same silicon wafer. Thereby, it is possible to improve the production efficiency, thereby saving the cost.

As shown in FIG. 13, probe terminals 20 are inserted from the second through-holes TH2 of the second silicon substrate 12 of the probe guide plate 1 of FIG. 11 into the first through-holes TH1 of the first silicon substrate 11, so that a probe device 2 is established.

In FIG. 13, elements such as an interconnection substrate to be connected to the probe terminals 20 are not shown. An interconnection substrate (not shown) of the probe device 2 is electrically connected with terminals of an inspection device (not shown) such as a measurement device. A variety of test signals are supplied from the inspection device to the testing target via the probe device 2, so that electric characteristics of the testing target are measured.

In FIG. 13, a semiconductor chip 30 is exemplified as the testing target, and bump electrodes 32 are provided with being exposed on a surface of the semiconductor chip 30. The probe terminals 20 of the probe device 2 are contacted to the bump electrodes 32 of the semiconductor chip 30, so that electric characteristics of the semiconductor chip 30 are measured.

In the probe guide plate 1 of the probe device 2 of FIG. 13, the first through-holes TH1 of the first silicon substrate 11 and the second through-holes TH2 of the second silicon substrate 12 are arranged with being aligned with high precision.

In this case, when inserting the probe terminals 20 from the second through-holes TH2 of the probe guide plate 1 into the first through-holes TH1, it is possible to smoothly insert the probe terminals 20 while the probe terminals 20 are not caught at peripheries of the first through-holes TH1.

In contrast, in the processes of FIGS. 9 and 10, when aligning the first silicon substrate 11 and the second silicon substrate 12, a positional deviation of about 10 μm may be caused between the first through-holes TH1 and the second through-holes TH2.

Figure 14:
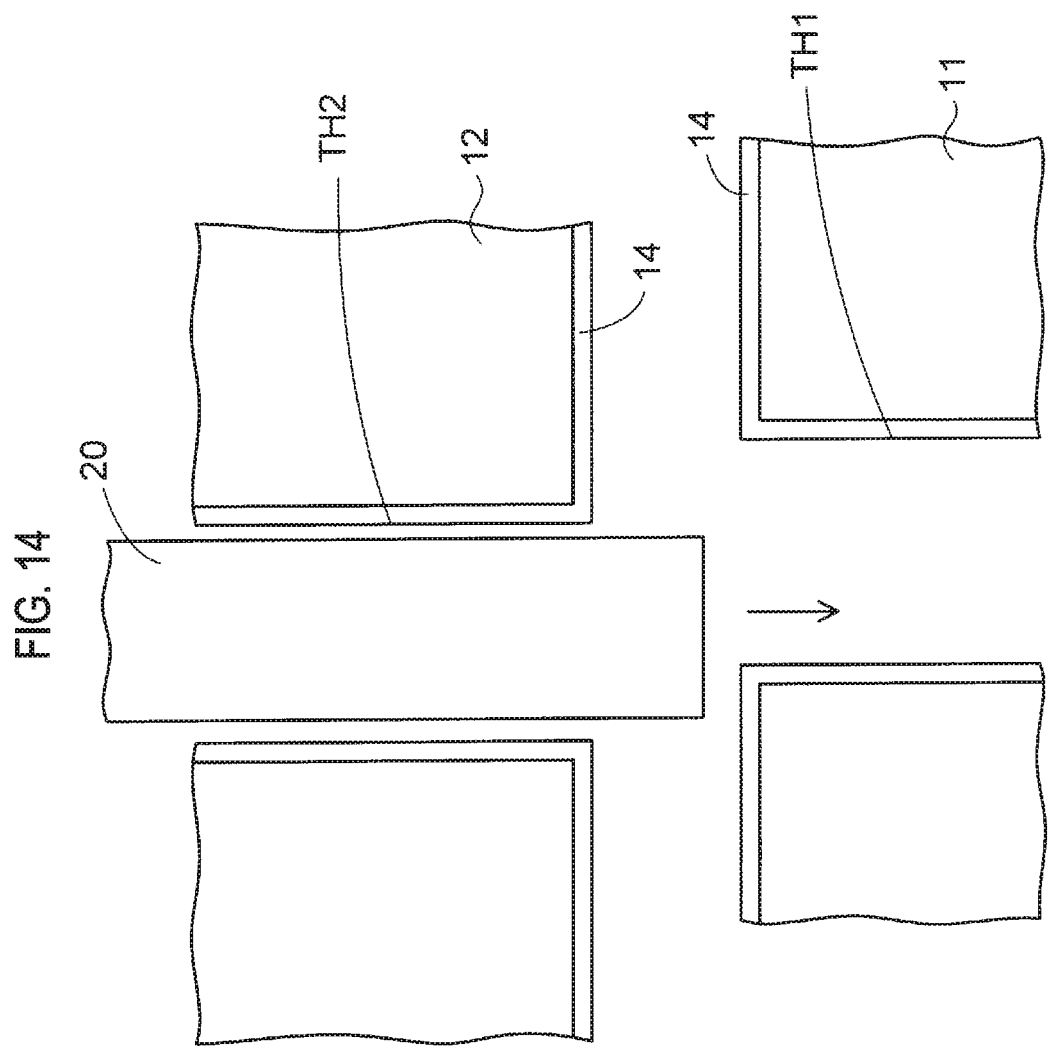
FIG. 14 is a sectional view depicting a situation where a probe terminal is being inserted into through-holes of a probe guide plate of a comparative example.

As a comparative example, FIG. 14 depicts a structure where the notch portion N is not formed at the upper end portion of the inner wall of the first through-hole TH1 and the first through-hole TH1 and the second through-hole TH2 are arranged with being misaligned, unlike the exemplary embodiment.

As shown in FIG. 14, in the comparative example, an upper end of the inner wall of the first through-hole TH1 is configured as an angled portion. For this reason, when inserting the probe terminal 20 from the second through-hole TH2 into the first through-hole TH1, the probe terminal 20 is contacted and caught at the periphery of the first through-hole TH1, so that it is not possible to smoothly insert the probe terminal 20.

Figure 15:
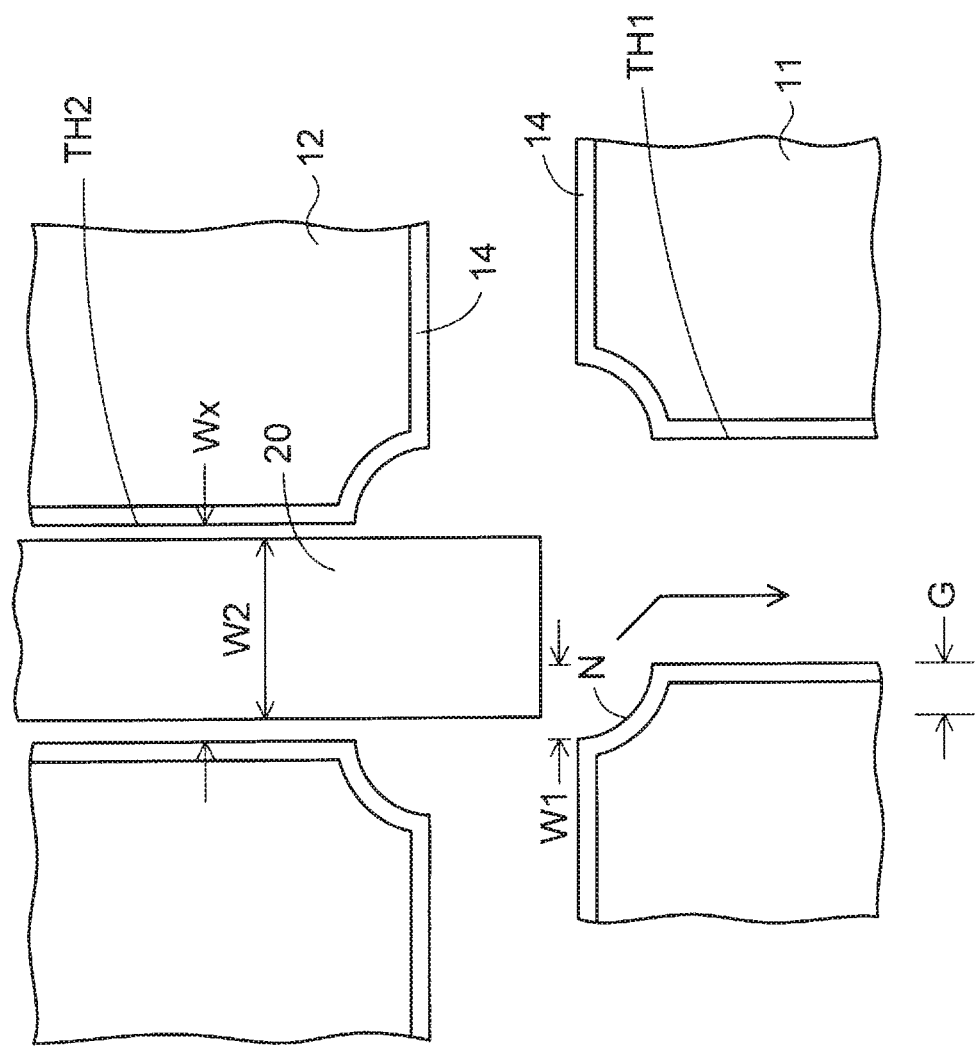
FIG. 15 is a sectional view depicting a situation where the probe terminal is being inserted into through-holes of the probe guide plate of the exemplary embodiment.

In contrast, as shown in FIG. 15, according to the probe guide plate 1 of the exemplary embodiment, the notch portion N is formed at the upper end portion of the inner wall of the first through-hole TH1 of the first silicon substrate 11, so that an opening diameter of the upper end of the first through-hole TH1 is made larger. Also, the notch portion N is inclined downward from the upper end toward the lower end.

For this reason, as shown in FIG. 15, even when the first through-hole TH1 and the second through-hole TH2 are arranged with being misaligned, a tip of the probe terminal 20 is contacted to an inner surface of the notch portion N formed at the upper end portion of the first through-hole TH1.

Thereby, the probe terminal 20 is guided downward so that it slides from the inner surface of the notch portion N, and is easily inserted into the first through-hole TH1, so that it can protrude downward from the first silicon substrate 11.

In this way, when inserting the probe terminal 20 into the second through-hole TH2 and the first through-hole TH1 of the probe guide plate 1, it is possible to smoothly insert the probe terminal 20 without being caught at the periphery of the lower-side first through-hole TH1.

Also, when actually measuring electric characteristics of a testing target, the probe terminal 20 is bent, so that it slides on the inner wall of the first through-hole TH1, as if it rubs the same.

At this time, since the first through-hole TH1 of the probe guide plate 1 has the notch portion N, a problem that the probe terminal 20 is caught at the upper end portion of the inner wall of the first through-hole TH1 or the upper end portion of the inner wall of the first through-hole TH1 is damaged is prevented.

Figure 16:
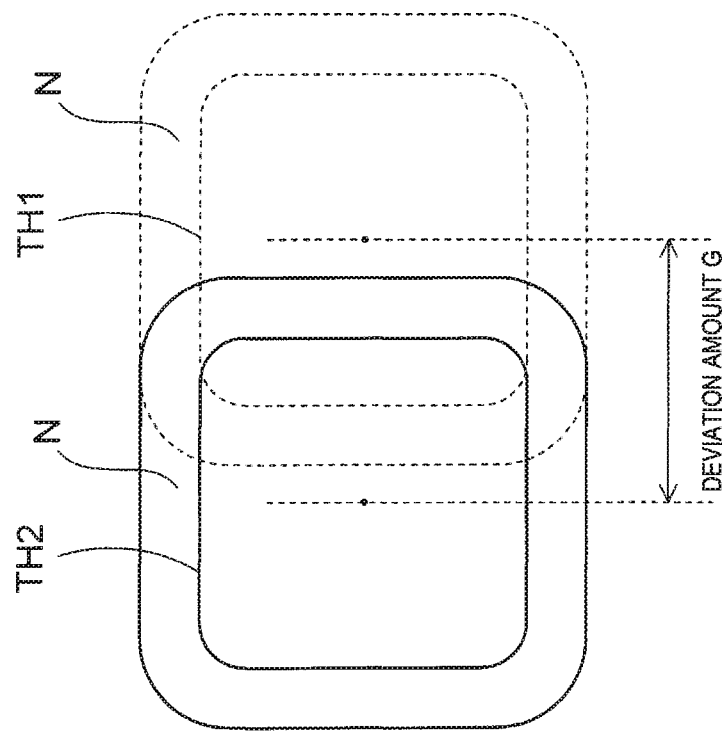
FIG. 16 is a plan view depicting a situation where first through-holes and second through-holes of the probe guide plate of the exemplary embodiment are arranged with being misaligned.

In FIG. 15, the first through-hole TH1 and the second through-hole TH2 are arranged with being misaligned by a positional deviation amount G (μm). FIG. 16 is a plan view depicting as aspect where the first through-hole TH1 and the second through-hole TH2 are arranged with being misaligned.

As shown in FIG. 16, the first through-hole TH1 and the second through-hole TH2 are arranged with being misaligned, as seen from above. In the plan view of FIG. 16, the second through-hole TH2 is horizontally misaligned from a position of the first through-hole TH1 by the positional deviation amount G (μm).

In order to easily understand the descriptions, the positional deviation amount G (μm) of FIG. 16 is shown greater than the positional deviation amount G (μm) of FIG. 15.

In FIG. 15, a width W1 (μm) of one side of the notch portion N formed at the first through-hole TH1 is set to be equal to or greater than the positional deviation amount G (μm) between the first through-hole TH1 and the second through-hole TH2. The width W1 of the notch portion N is a horizontal size from the upper end to the lower end of the notch portion N.

Also, in FIG. 15, when a wall part of the first silicon substrate 11 with the first through-hole TH1 is thin and thus it is not possible to form the width W1 of the notch portion N by the positional deviation amount G or greater, the width W1 of the notch portion N is preferably set on the basis of a following equation.

width $W1$ of notch portion $N$=(positional deviation amount $G$ between first through-hole $TH1$ and second through-hole $TH2$)−(opening width $Wx$ of second through-hole $TH2$−width $W2$ of probe terminal 20)

When the positional deviation as shown in FIG. 15 occurs and the width W1 of the notch portion N is set on the basis of the above equation, it is necessary to insert the probe terminal 20 into the first through-hole TH1 with being pressed to the left inner wall toward the second through-hole TH2. Thereby, it is possible to bring the tip of the probe terminal 20 into contact with the inner surface of the notch portion N.

Alternatively, the notch portion N may be partially formed at a part of the upper end portion of the inner wall of the first through-hole TH1. In this case, the probe terminal 20 is inserted with being pressed to the inner wall of the second through-hole TH2 in the same direction as a direction in which the notch portion N is formed, and the probe terminal 20 is inserted with being in contact with the inner surface of the notch portion N of the first through-hole TH1.

Herein, the reason that the probe terminals 20 are inserted into the second through-holes TH2 and the first through-holes TH1 after the first silicon substrate 11 and the second silicon substrate 12 are directly bonded is described.

Unlike the exemplary embodiment, a method of inserting the probe terminals 20 before bonding the first silicon substrate 11 and the second silicon substrate 12 is considered. In this case, the probe terminals 20 are first inserted into the second through-holes TH2 of the second silicon substrate 12. Then, the probe terminals 20 protruding from the second through-holes TH2 are inserted into the first through-holes TH1 of the first silicon substrate 11 and the first silicon substrate 11 and the second silicon substrate 12 are then bonded.

According to the method, there is a possibility that the positional deviation between the first through-holes TH1 of the first silicon substrate 11 and the second through-holes TH2 of the second silicon substrate 12 are not going to matter as much.

However, when directly bonding the first silicon substrate 11 and the second silicon substrate 12, it is necessary to perform the heating treatment to the temperature of about 1000° C. with the probe terminals 20 being inserted. Also, when forming the silicon oxide layer 14 on the exposed surfaces of the first silicon substrate 11 and the second silicon substrate 12, it is necessary to perform the thermal oxidization process, which is accompanied by the high-temperature heating processing, with the probe terminals 20 being inserted.

For this reason, the probe terminals 20 are also subjected to the high-temperature heating processing and are thus deformed. Thus, the above method cannot be adopted.

Therefore, after the first silicon substrate 11 and the second silicon substrate 12 are bonded and the silicon oxide layer 14 is formed, it is necessary to insert the probe terminals 20 into the second through-holes TH2 and the first through-holes TH1 of the probe guide plate 1.

For this reason, the first through-holes TH1 are provided with the notch portions N so that the probe terminals 20 can be easily inserted even when the positional deviation occurs between the first through-holes TH1 and the second through-holes TH2 of the probe guide plate 1.

Figure 17:
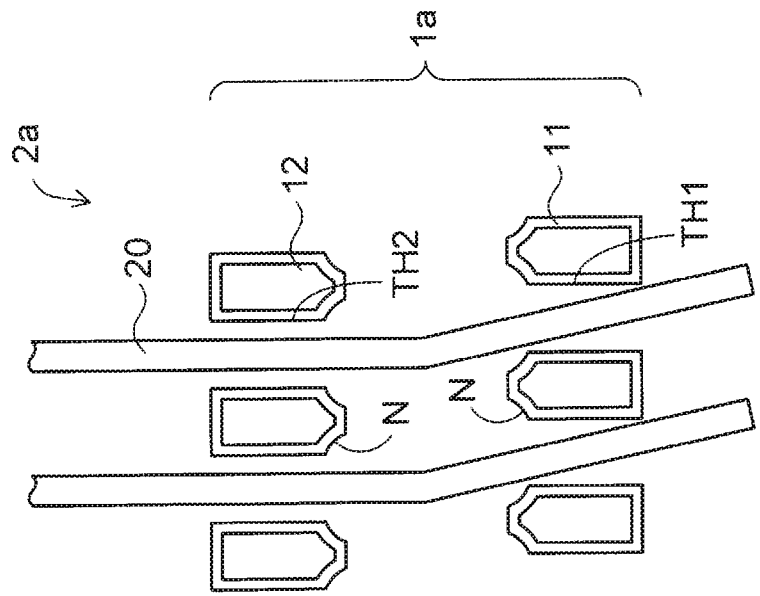
FIG. 17 is a partially sectional view depicting a situation where the probe terminals are inserted into a probe guide plate in accordance with a modified embodiment of the exemplary embodiment.

FIG. 17 depicts a probe guide plate 1a in accordance with a modified embodiment of the exemplary embodiment. In FIG. 17, the first through-holes TH1 of the first silicon substrate 11 and the second through-holes TH2 of the second silicon substrate 12 of the probe guide plate 1a and the probe terminals 20 are partially shown.

Like the probe device 2 of FIG. 13, the probe terminals 20 are inserted from the second through-holes TH2 of the probe guide plate 1a into the first through-holes TH1, so that a probe device 2a is established.

In the probe guide plate 1a of FIG. 17, the positions of the first through-holes TH1 and the second through-holes TH2 are arranged with being intentionally misaligned. The positional deviation amount between the first through-hole TH1 and the second through-hole TH2 is set to 10 μm to 20 μm, for example.

According to this aspect, since the first through-holes TH1 and the second through-holes TH2 are arranged with being intentionally misaligned, when the probe terminals 20 are inserted therein, the probe terminals 20 are bent. Thereby, since it is possible to alleviate stress, which is to be caused when the probe terminals 20 are contacted to the electrodes of the testing target, it is possible to reduce a damage to be caused in the testing target.

Also, since the bent directions of the plurality of probe terminals 20 are aligned in one same direction, the adjacent probe terminals 20 are prevented from being contacted to each other.

Even when the probe guide plate 1a of the above modified embodiment is adopted, since the first through-holes TH1 of the probe guide plate 1a have the notch portions N, it is possible to easily insert the probe terminals 20 from the second through-holes TH2 into the first through-holes TH1.

The probe guide plate 1a of the above modified embodiment shown in FIG. 17 is the same as the probe guide plate 1 of FIG. 11, except that the first through-holes TH1 and the second through-holes TH2 are arranged with being intentionally misaligned.

This disclosure further encompasses various exemplary embodiments, for example, described below.

1. A manufacturing method of a probe guide plate, the method comprising:
  preparing a silicon substrate having a plurality of guide plate regions defined therein;
  forming recess portions in the plurality of guide plate regions of the silicon substrate, respectively;
  forming through-holes in the silicon substrate at bottoms of the recess portions arranged in the plurality of guide plate regions, respectively;
  cutting the silicon substrate to divide and obtain a first silicon substrate and a second silicon substrate from the plurality of guide plate regions;
  making the recess portion of the first silicon substrate and the recess portion of the second silicon substrate face each other and directly bonding the second silicon substrate on the first silicon substrate so that the through-holes of the first silicon substrate and the through-holes of the second silicon substrate correspond to each other; and
  forming a silicon oxide layer on exposed surfaces of the first silicon substrate and the second silicon substrate.

2. The manufacturing method of a probe guide plate according to claim 1, further comprising:
  arranging a resin film on a surface of the silicon substrate in which the recess portions are formed, after the forming the recess portions and before the forming the through-holes,
  wherein in the forming the through-holes, the through-holes are formed by etching an opposite surface to the surface of the silicon substrate in which the recess portions are formed with an anisotropic dry etching, and end portions of inner walls of the through-holes, which face toward the recess portions, are formed with notch portions.

3. The manufacturing method of a probe guide plate according to claim 1, wherein in the forming the recess portions, recess portions for screwing holes are respectively formed at peripheral edge parts of the plurality of guide plate regions,
  wherein in the forming the through-holes, opening holes are respectively formed at the peripheral edge parts of the plurality of guide plate regions by etching an opposite surface to the surface of the silicon substrate in which the recess portions are formed, and
  wherein in the directly bonding the second silicon substrate on the first silicon substrate, the opening holes of the first silicon substrate and the opening holes of the second silicon substrate communicate with each other to form the screwing holes.

4. The manufacturing method of a probe guide plate according to claim 1, wherein in the preparing the silicon substrate, one or more silicon substrates are prepared, and
  wherein in the dividing and obtaining the first silicon substrate and the second silicon substrate, the first silicon substrate and the second silicon substrate are obtained from the one silicon substrate or are separately obtained from the silicon substrates.

5. A manufacturing method of a probe device, the method comprising:
  obtaining a probe guide plate, including:
  preparing a silicon substrate having a plurality of guide plate regions defined therein,
  forming recess portions in the plurality of guide plate regions of the silicon substrate, respectively,
  forming through-holes in the silicon substrate at bottoms of the recess portions arranged in the plurality of guide plate regions, respectively, and obtaining notch portions at end portions of inner walls of the through-holes, which face toward the recess portions,
  cutting the silicon substrate to divide and obtain a first silicon substrate and a second silicon substrate from the plurality of guide plate regions,
  making the recess portion of the first silicon substrate and the recess portion of the second silicon substrate face each other and directly bonding the second silicon substrate on the first silicon substrate so that the through-holes of the first silicon substrate and the through-holes of the second silicon substrate correspond to each other, and
  forming a silicon oxide layer on exposed surfaces of the first silicon substrate and the second silicon substrate; and
  inserting probe terminals from the through-holes of the second silicon substrate of the probe guide plate into the through-holes of the first silicon substrate.

What is claimed is:
1. A probe guide plate comprising:
  a first silicon substrate;
  a first recess portion formed in an upper surface of the first silicon substrate;
  first through-holes formed in the first silicon substrate at a bottom of the first recess portion;
  a second silicon substrate directly bonded on the first silicon substrate without another material;
  a second recess portion formed to face the first recess portion in a lower surface of the second silicon substrate; and second through-holes formed in the second silicon substrate at a bottom of the second recess portion and arranged to correspond to the first through-holes, wherein a first notch portion is formed at an upper end portion of an inner wall of each of the first through-holes of the first silicon substrate, and a second notch portion is formed at a lower end portion of an inner wall of each of the second through-holes of the second silicon substrate, wherein an upper end of each first notch portion is disposed at a boundary between a bottom of the first recess portion and a corresponding first through-hole, and a lower end of each second notch portion is disposed at a boundary between a top of the second recess portion and a corresponding second through-hole, wherein the first notch portion has a tapered shape and is inclined so that a height thereof gradually decreases as a distance in a width direction of the probe guide plate from the upper end of the first notch portion increases, the width direction being a direction that spans the first through-holes, wherein the second notch portion has a tapered shape and is inclined so that a height thereof gradually increases as the distance in the width direction of the probe guide plate from the lower end of the second notch portion increases.

2. The probe guide plate according to claim 1, wherein the first through-holes and the second through-holes are arranged with being misaligned, as seen from above.

3. The probe guide plate according to claim 2, wherein a width from an upper end to a lower end of each first notch portion and from a lower end to an upper end of each second notch portion is set to be equal to or greater than a positional deviation amount between the first through-hole and the second through-hole.

4. The probe guide plate according to claim 1, wherein a peripheral edge portion of the probe guide plate is formed with a screwing hole penetrating therethrough, and wherein an inner wall of the screwing hole has a step surface to which a head of a fixing screw is to be contacted.

5. A probe device comprising:

a probe guide plate comprising a first silicon substrate, a first recess portion formed in an upper surface of the first silicon substrate, first through-holes formed in the first silicon substrate at a bottom of the first recess portion, a first notch portion formed at an upper end portion of an inner wall of each of the first through-holes, a second silicon substrate directly bonded on the first silicon substrate without another material;

a second recess portion formed to face the first recess portion in a lower surface of the second silicon substrate, second through-holes formed in the second silicon substrate at a bottom of the second recess portion and arranged to correspond to the first through-holes, and a second notch portion formed at a lower end portion of an inner wall of each of the second through-holes, wherein an upper end of each first notch portion is disposed at a boundary between a bottom of the first recess portion and a corresponding first through-hole, and a lower end of each second notch portion is disposed at a boundary between a top of the second recess portion and a corresponding second through-hole, wherein the first notch portion has a tapered shape and is inclined so that a height thereof gradually decreases as a distance in a width direction of the probe guide plate from the upper end of the first notch portion increases, the width direction being a direction that spans the first through-holes, wherein the second notch portion has a tapered shape and is inclined so that a height thereof gradually increases as the distance in the width direction of the probe guide plate from the lower end of the second notch portion increases; and probe terminals inserted into the first through-holes from the second through-holes of the probe guide plate.

* * * * *